United States Patent [19]

Samata et al.

[11] Patent Number: 5,246,500
[45] Date of Patent: Sep. 21, 1993

[54] VAPOR PHASE EPITAXIAL GROWTH APPARATUS

[75] Inventors: Shuichi Samata; Yoshiaki Matsushita, both of Yokohama, Japan

[73] Assignee: Kabushiki Kaisha Toshiba, Kawasaki, Japan

[21] Appl. No.: 937,743

[22] Filed: Sep. 1, 1992

[30] Foreign Application Priority Data

Sep. 5, 1991 [JP] Japan ................... 3-226145

[51] Int. Cl.$^5$ ........................... C23C 16/00
[52] U.S. Cl. ....................... 118/719; 118/715; 118/725
[58] Field of Search ............ 118/715, 719, 725

[56] References Cited

PUBLICATIONS

Proceeding of 34th Symposium on Semiconductors and Integrated Circuit Technology (1988), pp. 19-24, T. Suzaki et al.
Extended Abstracts of the Japan Society of Applied Physics and Related Societies, 31p-ZF-11, S. Shishiguchi et al., (The 37th Spring Meeting, 1990).
John O. Borland and Clifford I. Drowley, "Advanced Dielectric Isolation Through Selective Epitaxial Growth Techniques", Solid State Technology, Aug. 1985, pp. 141-148.

Primary Examiner—Richard Bueker
Attorney, Agent, or Firm—Foley & Lardner

[57] ABSTRACT

A vapor phase growth apparatus is disclosed, which comprises a boat accommodating therein a plurality of semiconductor substrates, an inner tube surrounding the boat, an outer tube disposed outside the inner tube, a heater disposed outside the outer tube, a reaction gas injection nozzle disposed inside the inner tube and operating to eject a reaction gas against the semiconductor substrates, and a hydrogen halide gas injection nozzle disposed between the inner tube and the outer tube and operating to inject the hydrogen halide gas, wherein exhaust openings for exhausting the reaction gas are formed through a wall of the inner tube, thereby suppressing deposition of a reactant on an outer surface of the inner tube and an inner surface of the outer tube. The reaction gas injected from the reaction gas injection nozzle flows in the portion formed between the inner tube and the outer tube along with in the inner tube. Since the portion between the inner tube and the outer tube is heated by the heater disposed outside the outer tube, a reactant tends to be deposited on the outer surface of the inner tube and the inner surface of the outer tube. By injecting the hydrogen halide gas from the hydrogen halide gas injection nozzle to the portion formed between the inner tube and the outer tube, the deposition of the reactant can be suppressed.

5 Claims, 5 Drawing Sheets

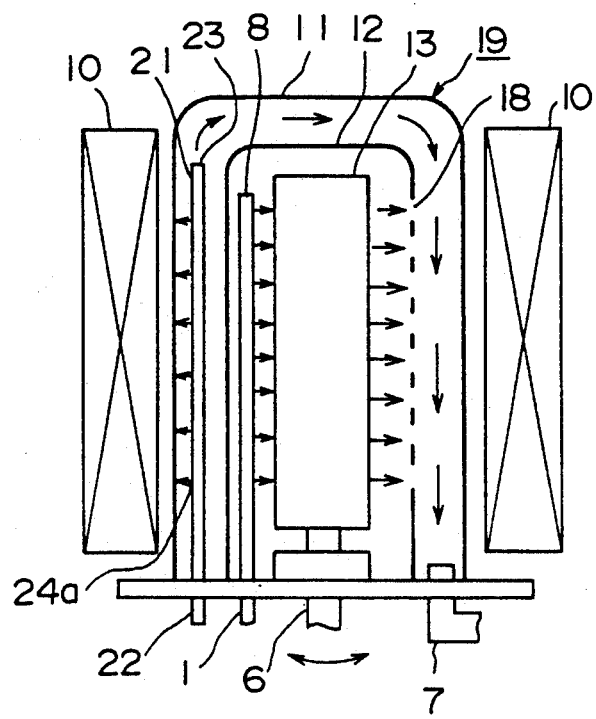
F I G. 3
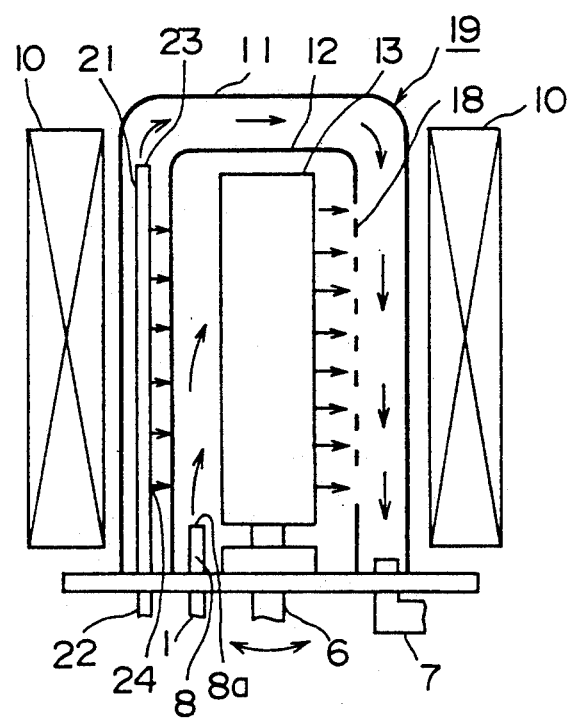
F I G. 4

VAPOR PHASE EPITAXIAL GROWTH APPARATUS

BACKGROUND OF THE INVENTION

1. Field of the Invention

The present invention relates to a vapor phase epitaxial growth apparatus for epitaxially growing silicon (Si) on a semiconductor substrate.

2. Description of the Prior Art

By the conventional silicon epitaxial growth method, a single crystalline lowly-doped semiconductor layer can be formed on a single crystalline highly-doped semiconductor layer. Alternatively, a single crystalline semiconductor layer can be selectively formed only at an opening portion of a semiconductor substrate (this is referred to as selective epitaxial growth method). This method can form semiconductor constructions which are difficult to accomplish by other methods. In addition, by the epitaxial growth method, since high-quality single crystalline layer free of defects can be obtained, this method can be applied to the production of various semiconductor devices such as bipolar LSI devices and part of MOS LSI devices.

As examples of vapor phase growth apparatuses for use in the Si epitaxial growth method, a Barrel Type shown in FIG. 7 and a Pancake Type shown in FIG. 8 are well known.

In FIG. 7, reference numeral 1 represents a reactive gas inlet tube. A heating lamp 3 is disposed around a quartz reaction tube 2. In the quartz reaction tube 2, a susceptor 4 for disposing semiconductor substrates 5 is provided. The susceptor 4 is rotated by a rotating shaft 6.

In FIG. 8, the same parts as those in FIG. 7 have the same reference numerals. The semiconductor substrates 5 are disposed on the susceptor 4. The semiconductor substrates 5 are heated from the lower portion of the susceptor 4 by use of RF current on working coil 9.

In FIGS. 7 and 8, a reaction gas received from the reaction gas inlet tube 1 causes a crystalize layer to grow on the layers of the semiconductor substrates 5. The resultant reaction gas is exhausted from an exhaust tube 7.

However, since such an apparatus can process only a small number of semiconductor substrates in a particular unit time, improvement of the process capacity of semiconductor wafers per unit time performance has been required. As the diameter of wafers increases, the number of wafers which can be processed in the unit time decreases. Thus, a countermeasure for decreasing the process cost has been desired.

According to such requirements, a vertical hot wall type vapor phase growth apparatus which laminately stacks wafers has gained popularity. FIG. 9 is a plan view of the vertical hot wall type vapor phase growth apparatus of a related art. The same parts as those in FIGS. 7, 8 and 9 have the same reference numerals.

In the vapor phase growth apparatus shown in FIG. 9, a reaction gas inlet tube 1 for introducing a reaction gas is disposed inside an inner tube 12 and in parallel with a side portion of a boat 13. The reaction gas inlet tube 1 is short in length and is disposed in the vicinity of a bottom portion of the boat 13. The reaction gas is sent upwardly from a top portion of the reaction gas inlet tube 1 and exhausted from an exhaust opening 17 at the top portion of the inner tube 13.

When the above-mentioned vertical hot wall type vapor phase growth apparatuses are used, the process capacity can be improved around 10 times higher than those of conventional apparatuses. Although these apparatuses have a problem of non uniformity of film thickness, by using a dual reaction tube or a nozzle for the reaction gas inlet tube 1, the flow of the reaction gas can be suitably controlled.

However, when the epitaxial growth of Si is conducted with the conventional vertical hot wall type vapor phase growth apparatuses, there is a problem of wall deposition where Si is deposited on a side wall of the dual reaction tube 19.

Wall deposition tends to take place uniformly on the inner surface of the inner tube 12 because the reaction gas tends to flow uniformly in the vicinity of the inner tube 12. This wall deposition can contribute to uniformity of the temperature distribution in the inner tube 12 because the heat from the heater 10 is mainly conducted by radiation. In other words, to prevent the temperature uniformity degradation of the inner tube 12, Si may be actively deposited on the inner wall of the inner tube 12.

On the other hand, wall deposition does not take place uniformly on the outer surface of the inner tube 12 and the inner surface of the outer tube 11 because the reaction gas does not flow uniformly between the inner tube 12 and the outer tube 11. Thus, the wall deposition of Si which takes place on the surfaces of quartz glass of the inner tube 12 and the outer tube 11 sometimes causes part of quartz glass to become opaque or grow a crack. Consequently, the wall surface of the dual reaction tube 19 becomes breakable, whereby a safety problem arises. In addition, since the temperature distribution in the dual reaction tube 19 becomes nonuniform, dust is easily generated.

SUMMARY OF THE INVENTION

Accordingly, an object of the present invention is to solve the problems of the above described prior art and to provide a vertical hot wall type vapor phase growth apparatus which can prevent wall deposition from taking place on the outer surface of the inner tube and the inner surface of the outer tube of the dual reaction tube.

To accomplish the above-mentioned object, the vapor phase growth apparatus of the present invention comprises a boat having a plurality of semiconductor substrates, an inner tube surrounding the boat, an outer tube disposed outside the inner tube, a heater disposed outside the outer tube, a reaction gas injection nozzle disposed inside the inner tube and adapted for injecting a reaction gas to the semiconductor substrates, and a hydrogen halide gas injection nozzle disposed between the inner tube and the outer tube and adapted for injecting the hydrogen halide gas, wherein exhaust openings for exhausting the reaction gas are formed on a wall surface of the inner tube, thereby suppressing deposition of a reactant on an outer surface of the inner tube and an inner surface of the outer tube.

According to the present invention, since there is provided a nozzle for injecting a hydrogen halide gas, the deposition of a reactant on the outer surface of the inner tube and the inner surface of the outer tube can be effectively suppressed.

These and other objects, features and advantages of the present invention will become more apparent in light of the following detailed description of preferred

BRIEF DESCRIPTION OF DRAWINGS

FIG. 3 is a vertical sectional view showing the construction of a second embodiment of the vapor phase growth apparatus according to the present invention;

FIG. 4 is a vertical sectional view showing the construction of a third embodiment of the vapor phase growth apparatus according to the present invention;

DESCRIPTION OF PREFERRED EMBODIMENTS

Figure 5:
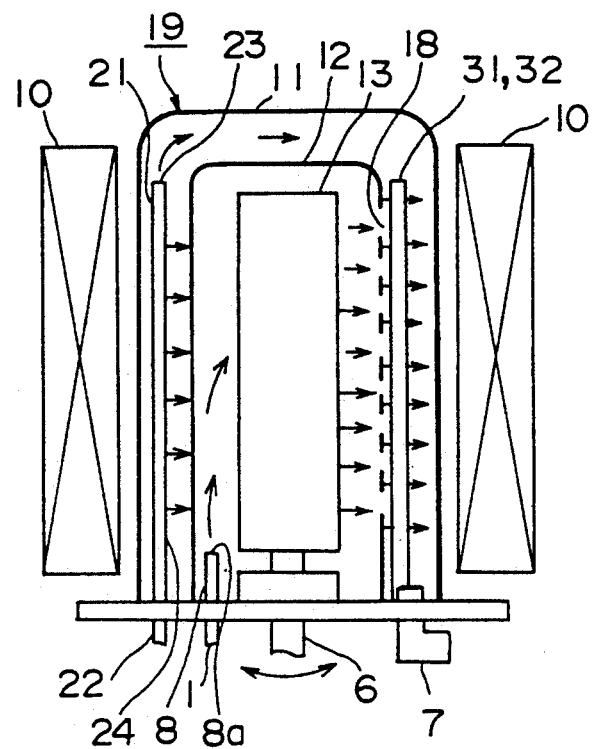
FIG. 5 is a vertical sectional view showing the construction of a fourth embodiment of the vapor phase growth apparatus according to the present invention.
Figure 6:
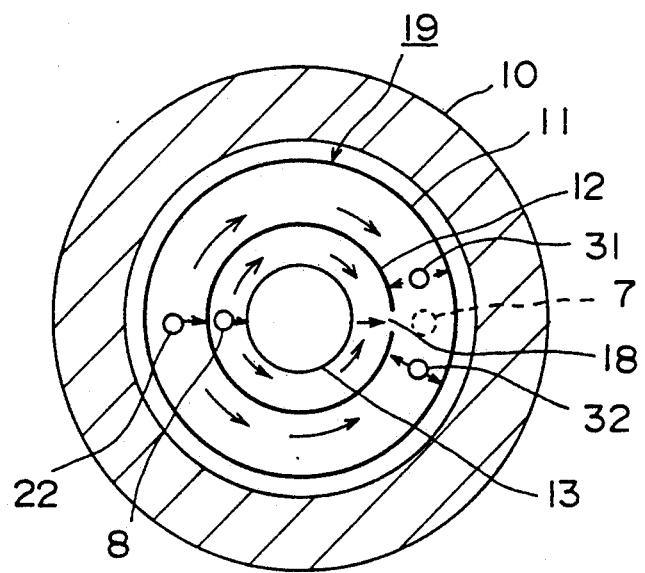
FIG. 6 is a horizontal sectional view showing the construction of the fourth embodiment of the vapor phase growth apparatus according to the present invention.
Figure 7:
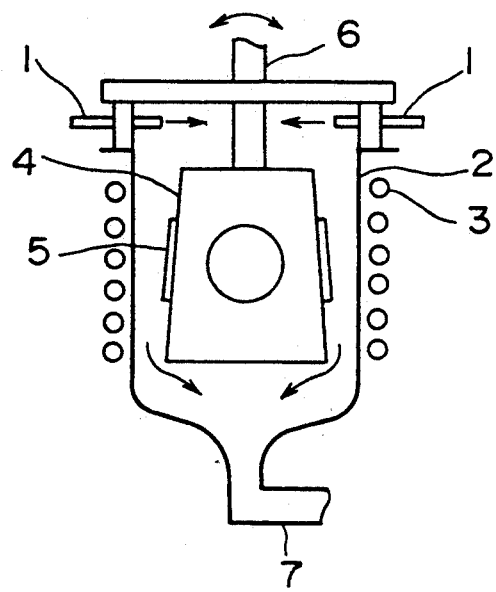
FIG. 7 is a vertical sectional view showing the construction of a conventional barrel type vapor phase growth apparatus for use in epitaxial growth method.
Figure 8:
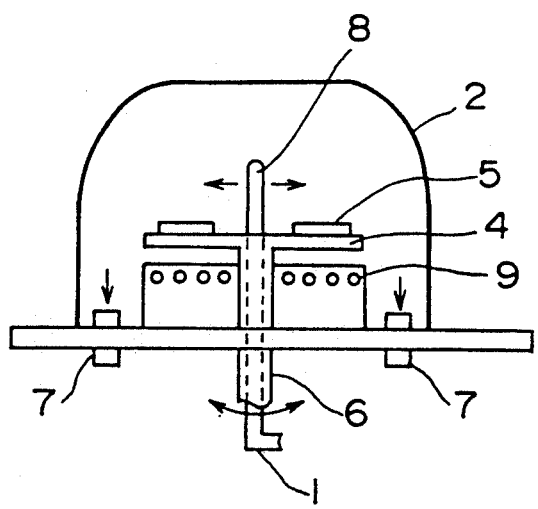
FIG. 8 is a vertical sectional view showing the construction of a conventional pancake type vapor phase growth apparatus for use in epitaxial growth method.
Figure 9:
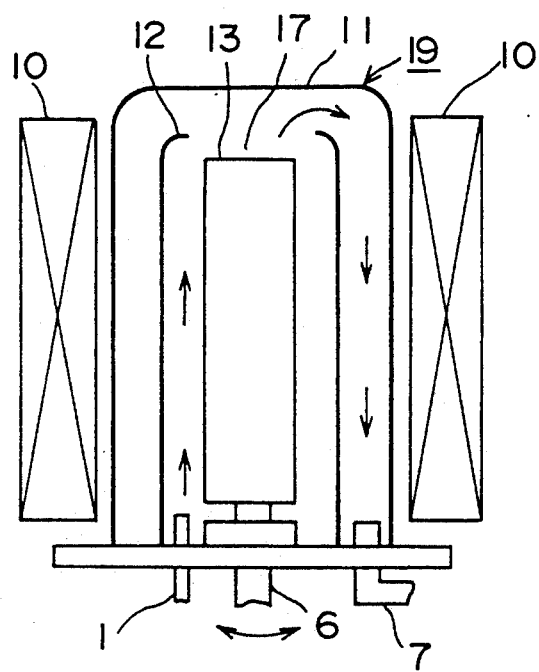
FIG. 9 is a vertical sectional view showing the construction of a conventional vapor phase growth apparatus using a dual reaction tube.

With reference to FIGS. 1 to 6, embodiments of the vapor phase growth apparatus according to the present invention will be described. The same parts as in the conventional apparatuses shown in FIGS. 7 to 9 have the same reference numerals.

Next, referring to FIGS. 1 and 2, a first embodiment of the present invention will be described. In these figures, a plurality of semiconductor substrates not shown in the figures are layered in a cylindrical boat 13. The bottom portion of the boat 13 is supported by a rotatable spindle 6. The boat 13 is disposed centrally in the inner tube 12. The inner tube 12 is made of quartz glass.

Between the boat 13 and the inner tube 12, a reaction gas injection nozzle 8 for injecting a reaction gas is vertically disposed. The reaction gas injection nozzle 8 is extend upward parallelly to the boat 8 to a position close to the top portion of the boat 13. A lower portion of the reaction gas injection nozzle 8 is connected to a reaction gas inlet tube 1 for introducing the reaction gas.

The reaction gas injection nozzle 8 has openings 8a spaced apart by specific intervals in the vertical direction at positions of the injection nozzle 8 confronting the boat 13, the openings 8a injecting the reaction gas. The inner tube 12 has reaction gas out let openings 18 spaced apart by specific distances in the vertical direction at a side surface of the inner tube 12 opposed to the injection nozzle 8.

The inner tube 12 is coaxially disposed in the outer tube 11 made of quartz glass. The outer tube 11 and the inner tube 12 constitute a dual reaction tube 19.

In the vicinity of the reaction gas injection nozzle 8 between the inner tube 12 and the outer tube 11, a hydrogen halide gas injection nozzle 21 for injecting a hydrogen halide gas is disposed vertically along the side surface of the dual reaction tube 19. The hydrogen halide gas injection nozzle 21 has a top injection opening 23 at a top portion thereof and side injection openings 24 spaced apart by specific distances in the vertical direction thereof. The upper end of the side injection opening 24 is higher than the exhaust opening 18. In addition, the side injection openings 24 are oriented to a side surface of the inner tube 12. A bottom portion of the hydrogen halide gas injection nozzle 21 is connected to the hydrogen halide gas inlet tube 22.

A heater 10 for heating the dual reaction tube 19 is disposed on the outer circumference of the outer tube 11.

Next, the operation of the above described embodiment will be described.

A reaction gas $SiH_2Cl_2+H_2$ is supplied from the reaction gas inlet tube 1 to the reaction gas injection nozzle 8. The temperature of the reaction chamber is approximately 900° C., and the pressure is approximately 5 Torr. The reaction gas is injected from the injection openings 8a and contacts the surfaces of the stacked semiconductor substrates in the boat 13, thereby epitaxially growing a Si single crystal with a thickness of approximately 5 $\mu$m. The reaction gas flows uniformly throughout in the entire inner tube 12. In addition, the reaction gas flows nonuniformly in the portion between the inner tube 12 and the outer tube 11. The reaction gas which is exhausted from the exhaust opening 18 is disposed of from an exhaust pipe 7 to the outside.

A hydrogen halide gas is supplied from the hydrogen halide gas inlet tube 22 to the injection nozzle 21. An example of the hydrogen halide gas is HCl. The hydrogen halide gas is supplied at a flow rate of 1 liter/minute. In addition, along with the hydrogen halide gas, hydrogen gas is supplied at a flow rate of 10 liters/minute. It is experimentally known that when the hydrogen gas is supplied at such a flow rate, wall deposition can be effectively suppressed.

The hydrogen halide gas and so forth which are injected from the top injection opening 23 at the top portion of the hydrogen halide gas injection nozzle 21 mainly flow along the inner surface at the top portion of the outer tube 11 and the inner surface of the side portion of the outer tube 11 opposed to the injection nozzle 21. The hydrogen halide gas and so forth which are injected from the side injection openings 24 mainly flow along the outer surface at the side portion of the inner tube 12 and the inner surface at the side portion of the outer tube 11. FIGS. 1 and 2 show the directions of flows of the reaction gas and the hydrogen halide gas with arrow marks.

The heat generated at the heater 10 is mainly transferred by radiant heat. The radiant heat is transferred through the quartz glass tubes constituting the dual reaction tube 19 and heats up the outer tube 11, the inner tube 12, the portion between the inner tube 12 and the inner tube 11, and the inner portion of the inner tube 12.

It is likely that the reason why the hydrogen halide gas and so forth can suppress the wall deposition of Si is as follows. When gases $SiH_2Cl_2$ and $H_2$ are reacted, Si is deposited and HCl is generated. In this case, by supplying the hydrogen halide gas and so forth from the injection nozzle 21, the generation of HCl can be chemical-equilibratedly suppressed, thereby preventing the wall deposition of Si.

EXAMPLE OF EXPERIMENT

With the construction and conditions of the above described embodiment, an experiment wherein a gas, HCl+$H_2$, was injected from the hydrogen halide gas injection nozzle 21 was carried out. The results of the experiment were as follows.

In this experiment, wall deposition of Si did not take place on the outer surface of the inner tube 12 and the inner surface of the outer tube 11. Since such wall deposition did not take place, the radiant heat from the heater 10 was not nonuniformly shielded. Thus, the temperature distribution in the reaction chamber was uniformly maintained.

Before performing the reaction of epitaxial growth, an airtightness test of the dual reaction tube 19 was conducted. In this airtightness test, no airtightness defect occurred. Thus, it was ascertained that there were no cracks in the outer tube 11 and the inner tube 12 which are made of quartz glass.

In addition, another experiment which was the same as the above described experiment except that the gas HCl+$H_2$ was not injected from the hydrogen halide gas injection nozzle 21 was conducted. In this experiment, the following results were obtained.

It was found that wall deposition of Si took place on the outer surface of the inner tube 12 and the inner surface of the outer tube 11. In particular, the wall deposition was remarkably observed on the outer surface of the inner tube 12 in the vicinity of the exhaust opening 18 at which exhaust gas was concentrated and on the inner surface of the outer tube 11. In addition, due to the wall deposition which takes place, nonuniformly, the radiant heat from the heater 10 was shielded nonuniformly whereby the temperature distribution in the reaction chamber became nonuniform.

Moreover, it was found that in the conventional airtightness test of the dual reaction tube 19, an airtightness defect occurred in the outer tube 11 and a crack occurred in the outer tube 11 made of quartz glass. As a result of investigation of why such a crack occurred, it was found that the quartz glass tube had become opaque due to wall deposition.

In addition, it was experimentally ascertained that by actively forming Si on the inner surface of the inner tube 12, the temperature in the dual reaction tube 19 can be made stable.

Thus, according to the construction of the above described embodiment, since the hydrogen halide gas injection nozzle 21 for injecting a gas, HCl+$H_2$, is disposed between the inner tube 12 and the outer tube 11, wall deposition which tends to take place on the outer surface of the inner tube 12 and the inner surface of the outer tube 11 can be effectively suppressed.

Moreover, since wall deposition does not take place on the outer surface of the inner tube 12 and the inner surface of the outer tube 11, the radiant heat generated by the heater 10 is not nonuniformly shielded. Thus, the temperature distribution in the reaction chamber does not become nonuniform. In addition, since the quartz glass does not become opaque and cracking without wall deposition the dual reaction tube 19 can be safely operated. Furthermore, the repair time with respect to the wall deposition can be remarkably reduced.

Next, with reference to FIG. 3, a second embodiment of the present invention will be described.

Figure 1:
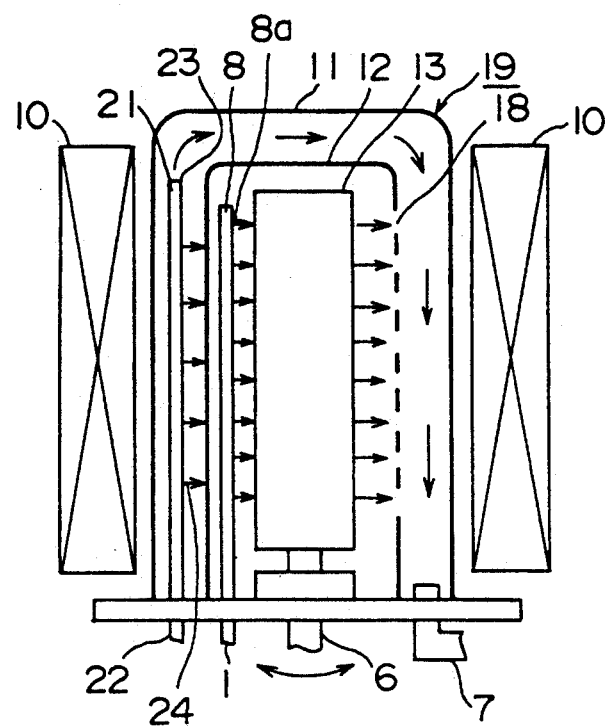
FIG. 1 is a vertical sectional view showing the construction of a first embodiment of the vapor phase growth apparatus according to the present invention.
Figure 2:
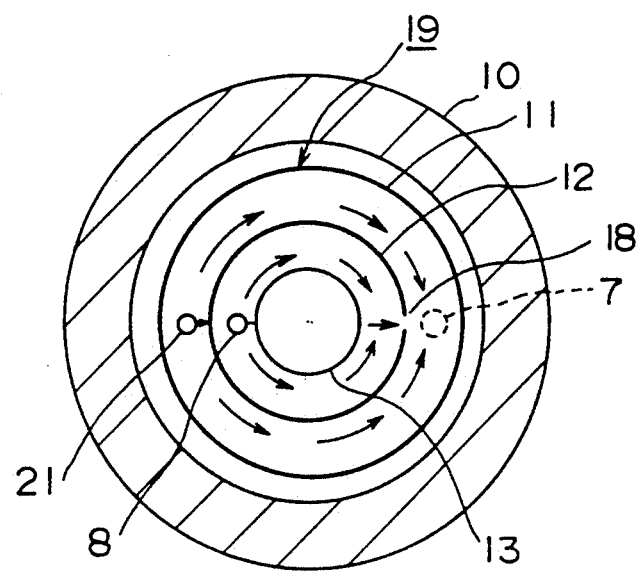
FIG. 2 is a horizontal sectional view showing the construction of the first embodiment of the vapor phase growth apparatus according to the present invention.

The construction of this embodiment is the same as that of the embodiment shown in FIGS. 1 and 2 except that the side injection openings 24a at the side portion of the hydrogen halide gas injection nozzle 21 are directed toward the inner surface at the side portion of the outer tube 11.

According to the construction of this embodiment, since a hydrogen halide gas injected from the side injection openings 24a is directly injected toward the inner surface at the side portion of the outer tube 11 in the vicinity of the injection nozzle 21, the gas tends to by-pass the entire inner surface at the side portion of the outer tube 11, thereby effectively suppressing the wall deposition which tends to take place on the inner surface of the outer tube 11.

Next, with reference to FIG. 4, a third embodiment of the present invention will be described.

The construction of this embodiment is the same as that of the embodiment shown in FIGS. 1 and 2 except that the reaction gas injection nozzle 8 is provided with only an injection opening 8a at the top portion thereof rather than the injection openings at the side portion thereof and that the height of the top portion of the reaction gas injection nozzle 8 is as low as that of the bottom portion of the boat 13.

According to the construction of this embodiment, the height of the top portion of the reaction gas injection nozzle 8 is the same as that of the bottom portion of the boat 13 and the reaction gas is injected upwardly from the injection opening 8a at the top portion. Therefore the reaction gas tends to uniformly fill the inner tube 12 and is not directly injected to the exhaust openings 18. Thus, in the vicinity of the exhaust openings 18, where the wall deposition tends to take place particularly, wall deposition can be effectively suppressed.

Next, with reference to FIGS. 5 and 6, a fourth embodiment of the present invention will be described.

In these figures, hydrogen halide gas injection nozzles 31 and 32 are symmetrically disposed in the vicinities on both sides of the exhaust openings 18 along with a hydrogen halide gas injection nozzle 22. The hydrogen halide gas injection nozzles 31 and 32 are provided respectively with injection openings 31a and 32a for injecting a gas toward an outer surface of an inner tube 12 and injection openings 31b and 32b for injecting a gas toward an inner surface of an outer tube 11. In addition, upper ends of the injection openings of the hydrogen halide gas injection nozzles 31 and 32 are higher than exhaust openings 18.

Like the construction shown in FIG. 4, the height of the reaction gas injection nozzle 8 shown in FIG. 5 is low. However, it should be noted that the height of the nozzle 8 may be high like the reaction gas injection nozzle 8 shown in FIGS. 1 and 2.

According to this embodiment, since the hydrogen halide gas injection nozzles 31 and 32 are disposed in the vicinities of both sides of the exhaust openings 18 along with the hydrogen halide gas injection nozzle 22, wall deposition which tends to take place particularly on the outer surface of the inner tube 12 and the inner surface of the outer tube 11 in the vicinity of the exhaust openings 18 can be effectively suppressed. In addition, it should be appreciated that although in the above described embodiments quartz glass was used as the material of the inner tube 12, even if SiC, SiC coated graphite, or GC coated graphite is used instead thereof, the wall deposition which tends to take place on the outer surface of the inner tube 12 and the inner surface of the outer tube 11 can be likewise suppressed.

In addition, it should be appreciated that although in the above embodiment, the exhaust openings 18 of inner tube 12 were opened on the side portion of the inner tube 12, the same efficiency as the above embodiment may be obtained in the case of forming exhaust openings at the top portion of the inner tube 12.

Furthermore, it should be noted that in the above described embodiments, although HCl was used as a hydrogen halide gas, HBr or HF can be used instead.

Although the present invention has been shown and described with respect to preferred embodiments thereof, it will be understood by those skilled in the art that the foregoing and various other changes, omissions, and additions in the form and detail thereof may be made therein without departing form the spirit and scope of the present invention.

What is claimed is:

1. A vapor phase growth apparatus, comprising:
    a boat accomodating therein a plurality of semiconductor substrates;
    an inner tube surrounding said boat;
    an outer tube disposed outside said inner tube;
    a heater disposed outside said outer tube;
    a reaction gas injection nozzle disposed in said inner tube and operating to inject a reaction gas against the semiconductor substrates; and
    a hydrogen halide gas injection nozzle disposed between said inner tube and said outer tube and operating to inject the hydrogen halide gas; wherein
    exhaust openings for exhausting the reaction gas are formed through a wall of said inner tube, thereby to suppress deposition of reactants on an outer surface of said inner tube and an inner surface of said outer tube.

2. The vapor phase growth apparatus as set forth in claim 1, wherein said hydrogen halide gas injection nozzle is disposed in the vicinity of said reaction gas injection nozzle, being separated from said reaction gas injection nozzle by the wall of said inner tube.

3. The vapor phase growth apparatus as set forth in claim 1, wherein said exhaust openings are formed through a side wall of said inner tube opposed to said reaction gas injection nozzle, and said hydrogen halide gas injection nozzle is disposed in the vicinities of both sides of said exhaust openings.

4. The vapor phase growth apparatus as set forth in claim 1, wherein said hydrogen halide gas injection nozzle has a plurality of injection openings at a side portion thereof and a top portion thereof.

5. The vapor phase growth apparatus as set forth in claim 4, wherein the height of the injection openings at the top portion of said hydrogen halide gas injection nozzle is higher than that of said exhaust openings.

* * * * *